United States Patent
Xu et al.

(12) 
(10) Patent No.: US 6,395,631 B1
(45) Date of Patent: May 28, 2002

(54) LOW DIELECTRIC CONSTANT DIELECTRIC LAYER FABRICATION METHOD EMPLOYING HARD MASK LAYER DELAMINATION

(75) Inventors: Yi Xu; Jian Xun Li, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/366,751

(22) Filed: Aug. 4, 1999

(51) Int. Cl.[7] ............... H01L 21/4763; H01L 21/302

(52) U.S. Cl. .............. 438/670; 438/623; 438/633; 438/637; 438/638; 438/639; 438/640; 438/710; 438/717

(58) Field of Search ............... 438/623, 631, 438/633, 637–640, 670, 700, 704, 710, 717, 725, 736–738, 743, 744, 745, 942, 951

(56) References Cited

U.S. PATENT DOCUMENTS

| | | | | |
|---|---|---|---|---|
| 5,192,714 A | * | 3/1993 | Suguro et al. | 438/631 |
| 5,482,894 A | | 1/1996 | Havemann | 437/195 |
| 5,488,015 A | | 1/1996 | Havemann et al. | 437/195 |
| 5,731,243 A | * | 3/1998 | Peng et al. | 438/612 |
| 5,759,906 A | | 6/1998 | Lou | 438/623 |
| 5,858,869 A | | 1/1999 | Chen et al. | 438/597 |
| 5,942,446 A | * | 8/1999 | Chen et al. | 438/734 |
| 6,007,733 A | * | 12/1999 | Jang et al. | 216/80 |
| 6,100,183 A | * | 8/2000 | Lu et al. | 438/637 |
| 6,127,070 A | * | 10/2000 | Yang et al. | 430/5 |

* cited by examiner

Primary Examiner—Ha Tran Nguyen
(74) Attorney, Agent, or Firm—George O. Saile; Rosemary L. S. Pike; Alek P. Szecsy

(57) ABSTRACT

A method for forming, within a low dielectric constant dielectric layer formed upon a substrate employed within a microelectronics fabrication, a conductor pattern employing a hard mask cap layer. There is first provided a substrate having conductor regions formed therein upon which is formed a low dielectric constant dielectric layer. There is then formed over the substrate a silicon containing hard mask cap layer. There is then formed over the hard mask cap layer a patterned photoresist etch mask layer. There is then subtractively etched employing the patterned photoresist etch mask layer and a first subtractive etching environment the pattern into the hard mask layer. There is then subtractively etched employing the patterned hard mask layer and a second etching environment the pattern into the low dielectric constant dielectric layer, simultaneously stripping the photoresist etch mask layer. There is then removed by delamination the hard mask cap layer employing a chemical treatment, leaving a trench pattern in the low dielectric constant dielectric layer. The trench pattern may be filled with a microelectronics material to form a patterned layer around which is a maximized amount of low dielectric constant dielectric material. The order of filling with microelectronics material and delamination of the hard mask layer may be reversed if desired to minimize the amount of patterned microelectronics material remaining above the substrate surface, in which case the method is a lift off method for patterning a microelectronics layer. After filling and patterning, the substrate surface may be planarized for further processing and optional additional microelectronics layers formed thereover.

9 Claims, 4 Drawing Sheets

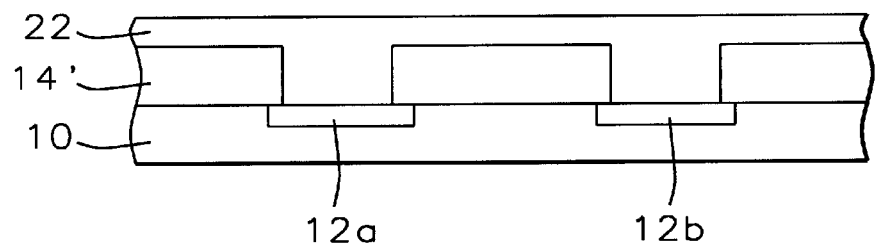
FIG. 4
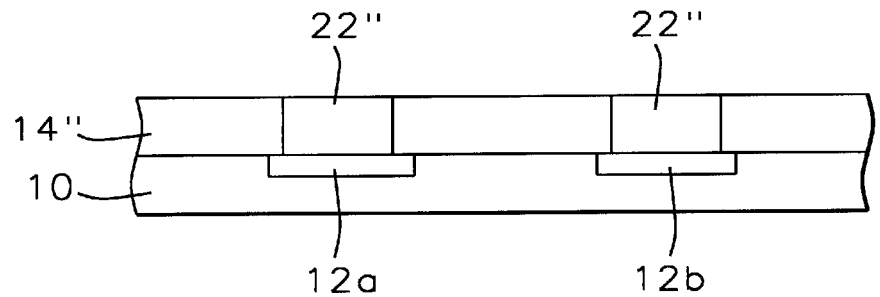
FIG. 5
FIG. 6
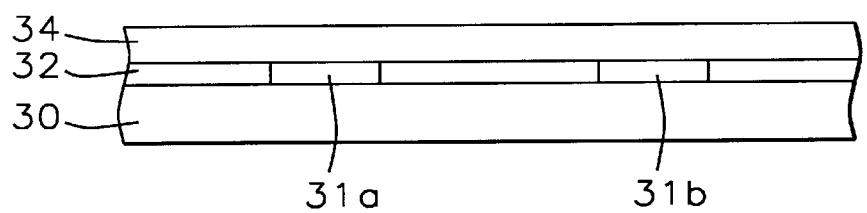
FIG. 7

LOW DIELECTRIC CONSTANT DIELECTRIC LAYER FABRICATION METHOD EMPLOYING HARD MASK LAYER DELAMINATION

BACKGROUND OF THE INVENTION

1. Field of the Invention

The invention relates to the field of microelectronics fabrications. More specifically, the invention relates to methods for forming patterned dielectric and conductor layers employed within microelectronics fabrications.

2. Description of the Related Art

Microelectronics fabrications employ various layers of microelectronics conductor, semiconductor and dielectric materials formed into patterns on substrates in order to build up the constituent portions of the fabrication. When multiple layers of patterned conductors are insulated from each other employing dielectric layers, it is desirable to reduce capacitance between conductor layers and between lines within a patterned conductor layer to optimize circuit speed and performance. Hence the employment of low dielectric constant (low-k) dielectric materials to form the insulator layers has become increasingly common.

Among the low dielectric constant dielectric materials available to form dielectric layers between conductors, especially desirable are the fluorine doped silicon containing glass (FSG) dielectric layers formed employing chemical vapor deposition (CVD), and organic polymer materials such as, for example, fluorinated poly (arylene ether) spin-on-polymer (SOP) dielectric materials. It is often necessary to form via contacts through such low-k layers and to form conductor patterns inlaid within trenches formed within such low-k layers by subtractive etching. Such patterned conductor layers afford a maximum amount of low dielectric constant dielectric material around the conductor lines. The etching methods employed are oxidizing and related plasmas which are often destructive of organic polymer photoresist etch mask layer materials conventionally employed, and require a non-reactive hard mask cap layer formed over the low-k layer as an etch mask layer. Typically such hard mask layers are formed of silicon containing dielectric materials such as silicon nitride employing methods such as plasma enhanced chemical vapor deposition (PECVD), high density plasma chemical vapor deposition (HDP-CVD) and atmospheric pressure chemical vapor deposition (APCVD).

While generally satisfactory as etching mask layers, such silicon containing hard mask layers are not without problems. In particular, the adhesion of layers of silicon containing dielectric materials to underlying layers of low-k dielectric materials may be marginal with respect to withstanding subsequent processing procedures employed after subtractive etching without delamination.

It is often of practical use to be able to form patterns in layers formed upon substrates which can then be subsequently delaminated by simple processing. The removal of a second layer overlying the patterned layer can then be effected when the patterned layer is detached from the substrate by the process, leaving behind the reverse of pattern of the second layer on the substrate. The principle may be employed to form patterns in microelectronics fabrications of material layers which are difficult to etch subtractively employing conventional methods.

It is thus towards the goal of employing low dielectric constant dielectric material in methods to form patterned conductor layers having maximized the amount of low dielectric constant dielectric layer around the conductor layers within microelectronics fabrications that the present invention is directed.

Various methods have been disclosed for forming patterned low dielectric constant dielectric layers and conductor layers employing hard mask cap layers within microelectronics fabrications.

For example, Havemann, in U.S. Pat. No. 5,482,894, discloses a method for forming a narrow aperture width high aspect ratio self-aligned contact via hole to access contact layer in an organic dielectric layer between patterned conductor layers employing a silicon oxide cap layer as an etching mask. The completed inter-level metal dielectric (IMD) layer is comprised of the organic dielectric layer and the intact remaining hard mask silicon oxide dielectric layer.

Further, Havemann et al., in U.S. Pat. No. 5,488,015, disclose a method for forming a low dielectric constant dielectric layer with reduced capacitance between adjacent conductors employing a porous dielectric material overlaid with a second non-porous dielectric cap layer. The porosity of the low dielectric constant dielectric underlayer is a function of its preparation from a precursor gel layer, and is protected by the cap layer formed of a non-porous material such as silicon oxide.

Still further, Lou et al., in U.S. Pat. 5,759,906, disclose a method for forming a an inter-level metal dielectric (IMD) layer employing PECVD silicon oxide layer and a low dielectric constant dielectric layer to provide reduced capacitance and RC time delay. The low dielectric constant dielectric layer is formed of multiple layers of spin-on-glass (SOG) or spin-on-polymer (SOP) dielectric materials. A cap layer of silicon oxide dielectric material, undoped or fluorine-doped, is formed over the low dielectric constant layer which permits planarization by chemical mechanical polish (CMP) planarization.

Finally, Chen et al., in U. S. Pat. No. 5,858,869, disclose a method for forming an inter-level metal dielectric (IMD) layer with low dielectric constant. The method employs an anisotropic silicon oxide layer formed over and along conductor lines, followed by a low dielectric constant polymer dielectric layer. After planarization polishing back to the top of the conductor lines, a fluorine doped silicon containing glass (FSG) layer is formed over the surface and via holes etched to complete the IMD layer.

Desirable in the field of microelectronics fabrication are additional methods employing hard mask cap layers for forming patterned low dielectric constant dielectric layers and conductor layers.

It is towards this goal that the present invention is generally and more specifically directed.

SUMMARY OF THE INVENTION

A first object of the present invention is to provide a method for forming a patterned conductor layer within a low dielectric constant dielectric layer upon a substrate employed within a microelectronics fabrication wherein the amount of low dielectric constant dielectric material is maximized around the patterned conductor layer.

A second object of the present invention is to provide a method in accord with the first method of the present invention, where the patterned low dielectric constant dielectric layer forms an inter-level metal dielectric (IMD) layer.

A third object of the present invention is to provide a method in accord with the first object of the present invention and the second object of the present invention, where the method is readily commercially implemented.

In accord with the objects of the present invention, there is provided a method for forming, within a low dielectric constant dielectric layer formed upon a substrate employed within a microelectronics fabrication, a patterned conductor layer employing a patterned hard mask cap layer to practice the invention, there is first provided a substrate having within it patterned conductor regions over which is formed a low dielectric constant dielectric layer etchable in a plasma. Formed over the low dielectric constant dielectric layer is a blanket silicon containing hard mask cap layer. There is then formed over the hard mask cap layer a patterned photoresist etch mask layer. There is then subtractively etched employing the patterned photoresist etch mask layer and a first etching environment the pattern through the hard mask layer, and then employing the hard mask layer as an etch mask and a second etching environment the pattern into the low dielectric constant dielectric layer. If the latter etching environment is an oxygen containing or oxidizing plasma, it may be simultaneously employed to strip the photoresist etch mask layer. Employing a suitable chemical treatment, the hard mask layer is then delaminated from the low dielectric constant dielectric layer, leaving an etched trench pattern within the dielectric layer. The pattern in the low dielectric constant dielectric layer is then filled with a microelectronics material to form an inlaid pattern. The order of filling and delamination of the hard mask layer may be reversed if it is desired to minimize the amount of excess material remaining on the substrate after filling the trench pattern in the dielectric material. The excess material may then be removed and the surface planarized by chemical mechanical polish (CMP) planarization to provide a co-planar surface. Subsequently, an upper patterned conductor layer may be formed over the substrate to complete an inter-level metal dielectric (IMD) layer with, maximized amount of low dielectric constant dielectric material around the patterned conductor layer.

The present invention provides a method for forming within a low dielectric constant dielectric layer formed over a substrate employing a patterned hard mask layer a patterned microelectronics layer which may be employed as a via contact stud layer or part of an inlaid conductor interconnection layer within an inter-level metal dielectric (IMD) layer. The present invention provides a method to maximize the amount of low dielectric constant dielectric material around the patterned microelectronics layer employed with an inter-metal dielectric (IMD) layer.

The present invention employs methods and materials which are known in the art of microelectronics fabrications, but in a novel order and sequence. The method of the present invention is therefore readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1, FIG. 2, FIG. 3, FIG. 4, FIG. 5 and FIG. 6 show a series of schematic cross-sectional diagrams illustrating the results of forming in accord with a general embodiment of the present invention within a low dielectric constant dielectric layer formed upon a substrate employed within a microelectronics fabrication, a patterned microelectronics layer employing a maximized amount of low dielectric constant dielectric material around the patterned microelectronics layer.

FIG. 7, FIG. 8, FIG. 9, FIG. 10, FIG. 11, and FIG. 12 show a series of schematic cross-sectional diagrams illustrating the results of forming in accord with a more specific embodiment of the present invention within a low dielectric constant dielectric layer formed over a substrate employed within an integrated circuit microelectronics fabrication a patterned conductor layer, employing a hard mask cap layer which is subsequently delaminated in a lift off process, where the low constant dielectric layer and patterned conductor layer form a inter-level metal dielectric (IMD) layer employing a maximized amount of low dielectric constant dielectric material around the patterned conductor layer.

DESCRIPTION OF THE PREFERRED EMBODIMENTS

The preset invention provides a method for forming, within a low dielectric constant dielectric layer upon a substrate employed within a microelectronics fabrication, a patterned conductor layer formed employing a hard mask cap layer. The method allows a maximized amount of low dielectric constant dielectric material to be employed around the patterned conductor layer. The method employs subtractive etching of the low dielectric constant dielectric layer and delamination of the hard mask cap layer to form the patterned conductor layer.

First Preferred Embodiment

Figure 1:
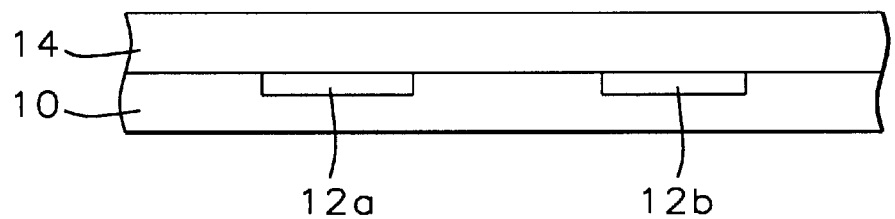

Referring now more particularly to FIG. 1 to FIG. 6, there is shown a series of schematic cross-sectional diagrams illustrating the results of forming, in accord with a general embodiment of the present invention which constitutes a first preferred embodiment of the present invention, within a dielectric layer formed over a substrate employed within a microelectronics fabrication a patterned microelectronics layer employing a process of delamination of a hard mask cap layer. FIG. 1 is a schematic cross-sectional diagram of a microelectronics fabrication at an early stage in its fabrication in accord with the first preferred embodiment of the present invention.

Shown in FIG. 1 is a substrate 10 having formed therein patterned conductor regions 12a and 12b over which is formed a low dielectric constant dielectric layer 14.

With respect to the substrate 10 shown in FIG. 1, the substrate 10 may be the substrate itself employed within a microelectronics fabrication. Alternatively, the substrate 10 may be any of several layers themselves formed over the substrate. The substrate 10 is employed within a microelectronics fabrication chosen from the group including but not limited to integrated circuit microelectronics fabrications, charge coupled device microelectronics fabrications, solar cell microelectronics fabrications, radiation emitting microelectronics fabrications, optoelectronics display microelectronics fabrications, ceramics substrate microelectronics fabrications and flat panel display microelectronics fabrications. The substrate 10 may be formed of materials including but not limited to microelectronics conductor materials, microelectronics semiconductor materials and microelectronics dielectric materials. Preferably the substrate 10 is a microelectronics dielectric substrate within which is formed patterned microelectronics conductor regions 12a and 12b employing materials including but not limited to metals, alloys, conductive compounds and semiconductors. Preferably the patterned microelectronics conductor regions 12a and 12b are formed employing a patterned metal conductor material.

With respect to the dielectric layer 14 shown in FIG. 1, the dielectric layer 14 is formed of low dielectric constant dielectric material employing chemical vapor deposition (CVD) or, alternatively organic polymer spin-on-polymer (SOP) dielectric material, preferably formed to a thickness of from about 3000 to about 12000 angstroms. Preferably the low dielectric constant dielectric layer is formed employing fluorinated poly (arylene ether) spin-on-polymer (SOP) low dielectric constant dielectric material commercially available as FLARE supplied by Allied Signal Corporation, Sunnyvale, Calif., U.S.A.

Figure 2:
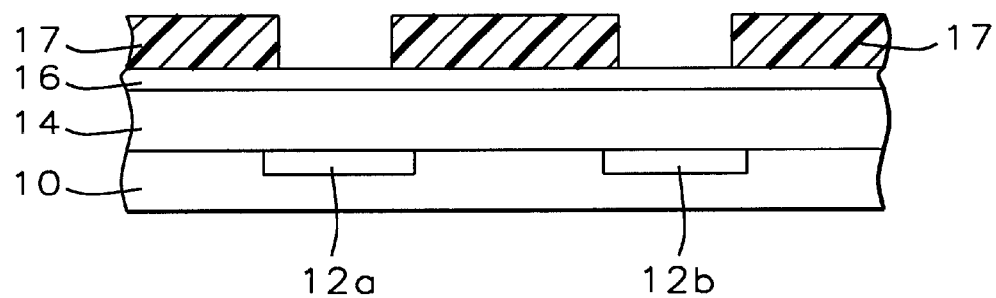

Referring now to FIG. 2, there is shown a schematic cross-sectional diagram illustrating the results of further processing of the microelectronics fabrication whose schematic cross-sectional diagram is shown in FIG. 1 in accord with the first preferred embodiment of the present invention. Shown in FIG. 2 is a microelectronics fabrication otherwise equivalent to the microelectronics fabrication shown in FIG. 1, but where there has been formed over the substrate a hard mask cap layer 16 employing silicon containing dielectric material. Formed over the hard mask layer 16 is a patterned photoresist etch mask layer 17.

With respect to the hard mask layer 16 shown in FIG. 2, the hard mask layer 16 is a silicon containing dielectric material formed employing methods known in the art of microelectronics fabrication including but not limited to plasma enhanced chemical vapor deposition (PECVD) methods, high density plasma chemical vapor deposition (HDP-CVD) methods, sub-atmospheric pressure thermal chemical vapor deposition (SACVD) methods, near atmospheric pressure chemical vapor deposition (APCVD) methods and physical vapor deposition (PVD) sputtering methods. Preferably the hard mask layer 16 is formed of silicon nitride material employing plasma enhanced chemical vapor deposition (PECVD in accord with the following process: (1) source gases: silane ($SiH_4$) at a flow rate of form about 50 to about 200 standard cubic centimeters per minute (sccm) and nitrous oxide ($N_2O$) at a flow rate of from about 1500 to about 3000 standard cubic centimeters per minute (sccm); (2) temperature of from about 350 to about 400 degrees centigrade; (3) pressure of from about 1 to about 10 torr; and (4) power from about 50 to about 200 watts. Preferably the hard mask layer 14 is formed to a thickness of about 200 to about 500 angstroms.

With respect to the patterned photoresist etch mask layer 17 shown in FIG. 2, the patterned photoresist etch mask layer 17 is formed employing photolithographic methods and materials as are known in the art of microelectronics fabrication.

Figure 3:
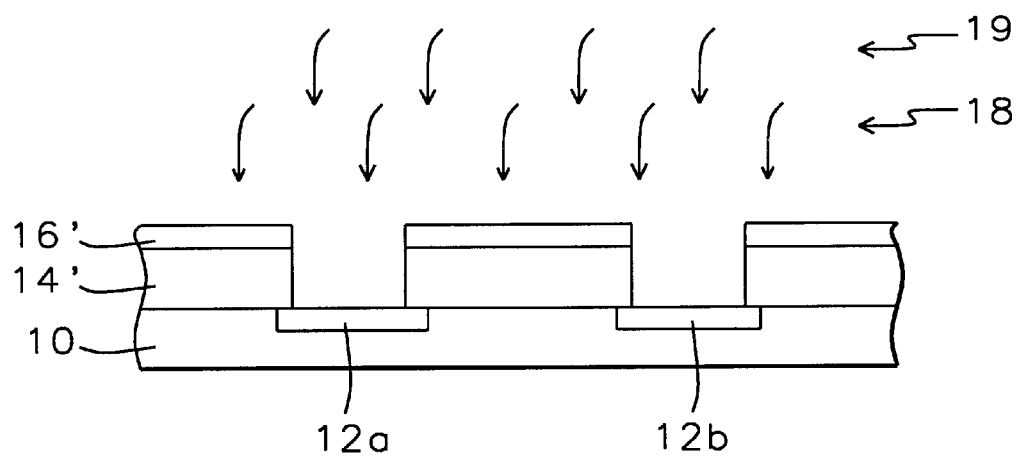

Referring now more particularly to FIG. 3, there is shown a schematic cross-sectional diagram illustrating the results of further processing of the microelectronics fabrication whose schematic cross-sectional diagram is shown in FIG. 2 in accord with the first preferred embodiment of the present invention. Shown in FIG. 3 is a microelectronics fabrication otherwise equivalent to the microelectronics fabrication shown in FIG. 2, but where there has been subtractively etched a pattern employing a first subtractive etching environment 18 and the patterned photoresist etch mask layer 17 to etch a pattern into and through the hard mask layer 16', and employing a second etching environment 19 and the patterned hard mask layer 16' to etch the pattern into and through the low dielectric constant dielectric layer 14', followed by stripping of any residues of the photoresist etch mask layer 17 not already removed by the second etching environment 19.

With respect to the first subtractive etching environment 18 shown in FIG. 3, the first subtractive etching environment 18 employs an oxidizing fluorinating plasma in accord with the following process: (1) gases: difluoromethane ($CH_2F_2$) from about 10 to about 50 standard cubic centimeters per minute (sccm), oxygen ($O_2$) from about 10 to about 30 standard cubic centimeters per minute (sccm), and argon from about 50 to about 200 standard cubic centimeters per minute(sccm); (2) pressure from about 300 to about 800 mTorr; and (3) radiofrequency power form about 800 to about 1500 watts.

With respect to the second subtractive etching environment 19 shown in FIG. 3, the second subtractive etching environment 19 employs an oxidizing plasma in accord with the following process: (1) gases: nitrogen from about 100 to about 300 standard cubic centimeters per minute (sccm); hydrogen from about 100 to about 300 standard cubic centimeters per minute (sccm); perfluorobutane ($C_4F_8$) from about 1 to about 10 standard cubic centimeters per minute (sccm); (2) pressure form about 300 to about 800 mTorr; and (3) radiofrequency power from about 800 to about 1500 watts.

Referring now more particularly to FIG. 4, there is shown a schematic cross-sectional diagram illustrating the results of further processing of a microelectronics fabrication whose schematic cross-sectional diagram is shown in FIG. 3 in accord with the first preferred embodiment of the present invention. Shown in FIG. 4 is a microelectronics fabrication otherwise equivalent to the microelectronics fabrication shown in FIG. 3, but where there has been delaminated the etched hard mask layer 16' employing a chemical cleaning method 20.

With respect to the chemical cleaning method 20 shown in FIG. 4, the chemical cleaning method 20 employs methods and materials as are known in the art of microelectronics fabrication. Preferably the cleaning method employs a wet chemical treatment with the commercial cleaning agent EKC 265.

Referring now more particularly to FIG. 5, there is shown a schematic cross-sectional diagram illustrating the results of further processing of the microelectronics fabrication whose schematic cross-sectional diagram is shown in FIG. 4 in accord with the first preferred embodiment of the present invention. Shown in FIG. 5 is a microelectronics fabrication otherwise equivalent to the microelectronics fabrication shown in FIG. 4, but where there has been formed over the etched dielectric layer 14' a microelectronics conductor layer 22.

With respect to the microelectronics conductor layer 22 shown in FIG. 5, the microelectronics conductor layer 22 is formed employing methods as are known in the art of microelectronics fabrication of materials including but not limited to microelectronics conductor materials and microelectronics semiconductor materials. Preferably the microelectronics layer 22 is formed of a microelectronics conductor material in a thickness equal or greater than the thickness of the dielectric layer 14'.

Referring now more particularly to FIG. 6, there is shown a schematic cross-sectional diagram illustrating the final results of processing the microelectronics fabrication whose schematic cross-sectional diagram is shown in FIG. 5 in accord with the first preferred embodiment of the present invention. Shown in FIG. 6 is a microelectronics fabrication otherwise equivalent to the microelectronics fabrication shown in FIG. 5, but where there has been planarized the surface of the substrate to form a coplanar surface of the microelectronics conductor layer 22' 22' and the dielectric layer 14".

With respect to the planarized surfaces 22" and 14" of the microelectronics layer and the dielectric layer 14' respectively shown in FIG. 6, the planarized surfaces are formed employing chemical mechanical polish (CMP) planarization methods as are known in the art of microelectronics fabrication.

The first preferred embodiment of the present invention provides a method for forming a patterned microelectronics conductor layer within a low dielectric constant dielectric layer upon a substrate employed within a microelectronics fabrication suitable for further processing steps if desired employed in accord with methods and materials known in the art of microelectronics fabrication. The patterned microelectronics conductor layer has formed around it a maximized amount of low dielectric constant dielectric material.

Second Preferred Embodiment

Referring now to FIG. 7 to FIG. 12, there is shown a series of schematic cross-sectional diagrams illustrating the results of forming patterned microelectronics conductor and low dielectric constant dielectric layers upon a semiconductor substrate employed within an integrated circuit microelectronics fabrication in accord with a more specific embodiment of the present invention which constitutes a second preferred embodiment of the present invention. FIG. 7 is a schematic cross-sectional diagram of an integrated circuit microelectronics fabrication at an early stage in its fabrication in accord with a second preferred embodiment of the present invention.

Shown in FIG. 7 is a semiconductor substrate 30 having formed over it a dielectric layer 32 within which are formed conductor regions 31a and 31b to form a patterned microelectronics conductor layer. Formed over the substrate is a low dielectric constant dielectric layer 33.

With respect to the semiconductor substrate 30 shown in FIG. 7, the semiconductor substrate 30 is analogous to the substrate 10 shown in FIG. 1 of the first preferred embodiment of the present invention. The substrate 30 is chosen from the group of microelectronics semiconductor materials including single crystalline silicon and germanium, III–V compound semiconductor materials such as gallium arsenide, gallium phosphide, and II–VI compound semiconductor materials such as lead sulfide, lead telluride and lead selenide. Preferably the substrate 30 is a silicon semiconductor substrate.

With respect to the dielectric layer 32 shown in FIG. 7, the dielectric layer 32 may be formed of dielectric materials known in the art of microelectronics fabrications including but not limited to silicon containing dielectric materials and organic polymer dielectric materials, employing methods known in the art of microelectronics fabrications including but not limited to chemical vapor deposition (CVD), spin-on-glass (SOG) and spin-on-polymer (SOP) methods. Preferably the dielectric layer 32 is formed of low dielectric constant dielectric material employing spin-on-polymer (SOP) methods.

With respect to the conductor regions 31a and 31b shown in FIG. 7, the conductor regions 31a and 31b may be formed of microelectronics conductor materials including but not limited to metals, alloys, conductive compounds, semiconductors and mixtures of same formed employing methods as are known in the art of microelectronics fabrications.

With respect to the low dielectric constant dielectric layer 34 shown in FIG. 7, the low dielectric constant dielectric layer 34 is analogous to the dielectric layer 14 shown in FIG. 1 of the first preferred embodiment of the present invention.

Preferably, the low dielectric constant dielectric layer 32 is formed of materials and methods equivalent or analogous to the preferred materials and methods employed to form the dielectric layer 14 of the first preferred embodiment of the present invention.

Figure 8:
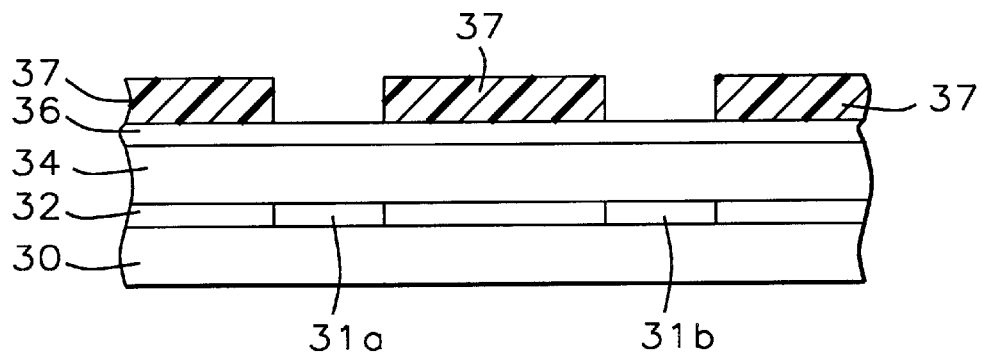

Referring now more particularly to FIG. 8, there is shown a schematic cross-sectional diagram of an integrated circuit microelectronics fabrication illustrating the results of further processing of the integrated circuit microelectronics fabrication whose schematic cross-sectional diagram is shown in FIG. 7 in accord with the second preferred embodiment of the present invention. Shown in FIG. 8 is an integrated circuit microelectronics fabrication otherwise equivalent to the integrated circuit microelectronics fabrication shown in FIG. 7, but where there has been formed over the substrate a hard mask cap layer 36. Formed over the hard mask layer 34 is a first patterned photoresist etch mask layer 37.

With respect to the hard mask cap layer 36 shown in FIG. 8, the hard mask cap layer 36 is analogous to or equivalent to the hard mask layer 16 shown in FIG. 2 of the first preferred embodiment of the present invention.

With respect to the first patterned photoresist etch mask layer 37 shown in FIG. 8, the first patterned photoresist etch mask layer 37 is analogous or equivalent to the patterned photoresist etch mask layer 17 shown in FIG. 2 of the first preferred embodiment of the present invention.

Figure 9:
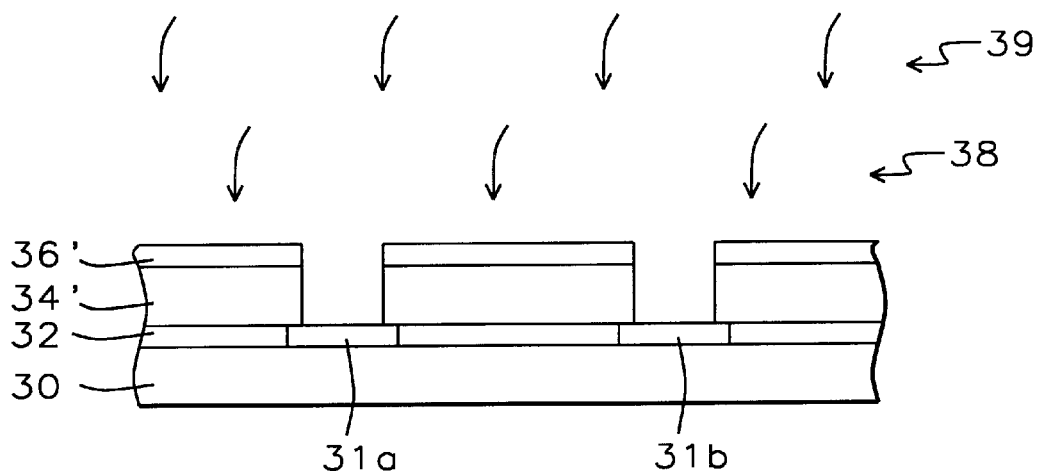

Referring now more particularly to FIG. 9, there is shown a schematic cross-sectional diagram illustrating the results of further processing of the integrated circuit microelectronics fabrication whose schematic cross-sectional diagram is shown in FIG. 8 in accord with the second preferred embodiment of the present invention. Shown in FIG. 9 is an integrated circuit microelectronics fabrication otherwise equivalent to the integrated circuit microelectronics fabrication shown in FIG. 8, but where there has been subtractively etched a pattern employing a first etching environment 38 and the first patterned photoresist etch mask layer 37 into and through the hard mask layer 36', followed by subtractive etching employing a second etching environment 39 and the patterned hard mask layer 36' the pattern into the low dielectric constant dielectric layer 34' to the conductor regions 31a and 31b, simultaneously stripping of the first patterned photoresist etch mask layer 37 by the second etching environment 39.

With respect to the first etching environment 38 and second etching environment 39 shown in FIG. 9, the first etching environment 38 is analogous or equivalent to the first etching environment 18 shown in FIG. 3 of the first preferred embodiment of the present invention. The second etching environment 39 is analogous or equivalent to the second etching environment 19 shown in FIG. 3 of the first preferred embodiment of the present invention.

Figure 10:
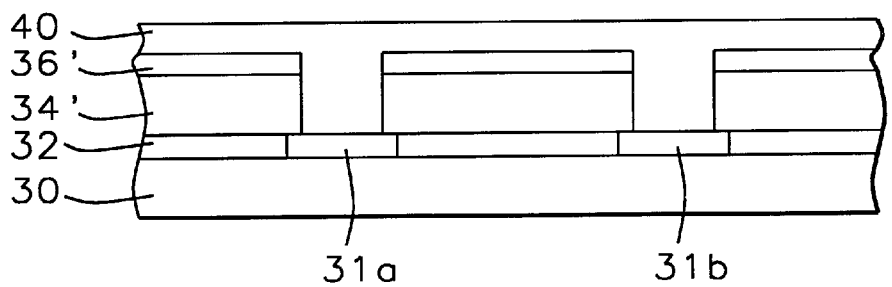

Referring now more particularly to FIG. 10, there is shown a schematic cross-sectional diagram illustrating the results of further processing of the integrated circuit microelectronics fabrication whose schematic cross-sectional diagram is shown in FIG. 9 in accord with the second preferred embodiment of the present invention. Shown in FIG. 10 is an integrated circuit microelectronics fabrication otherwise equivalent to the microelectronics fabrication shown in FIG. 9, but where there has been formed over the substrate a second conductor layer 40.

With respect to the second conductor layer 40 shown in FIG. 10, the second conductor layer 40 is formed of a microelectronics conductor material employing a method which such as is known in the art of microelectronics fabrication to provide a semi-planar layer formed over the substrate. Preferably the second conductor layer 40 is aluminum or a mixture of aluminum and copper formed employing thermal vacuum evaporation, physical vapor deposition (PVD) sputtering or electrochemical deposition (ECD) plating methods.

Figure 11:
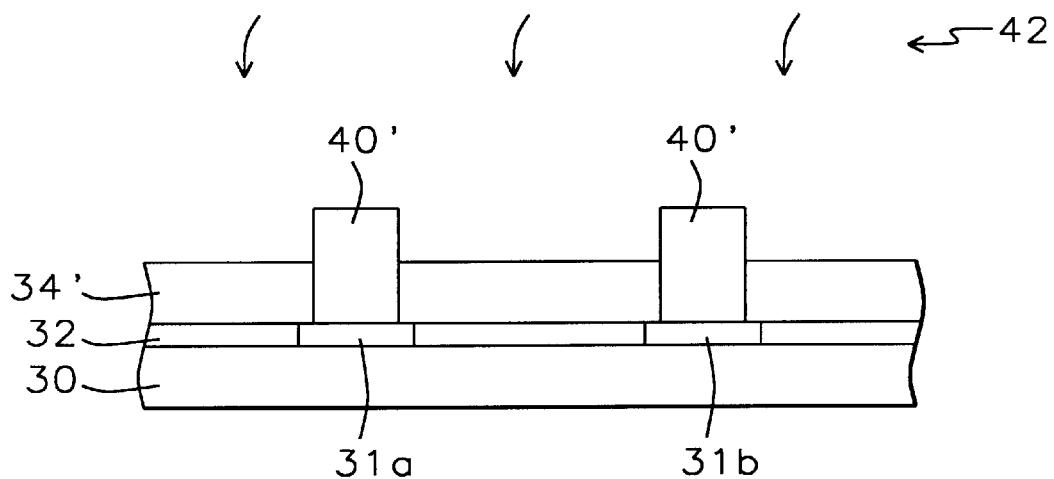

Referring now more particularly to FIG. 11, there is shown a schematic cross-sectional diagram illustrating the results of further processing of the integrated circuit microelectronics fabrication whose schematic cross-sectional diagram is shown in FIG. 10 in accord with the second preferred embodiment of the present invention. Shown in FIG. 11 is an integrated circuit microelectronics fabrication otherwise equivalent to the integrated circuit microelectronics fabrication shown in FIG. 10, but where there has been delaminated and lifted off the hard mask layer 36' employing the chemical treatment 42 to leave the raised portions of the inlaid conductor layer pattern 40'.

With respect to the chemical treatment 42 shown in FIG. 11, the chemical treatment 42 is analogous to the wet chemical treatment 20 shown in FIG. 4 of the first preferred embodiment of the present invention.

Figure 12:
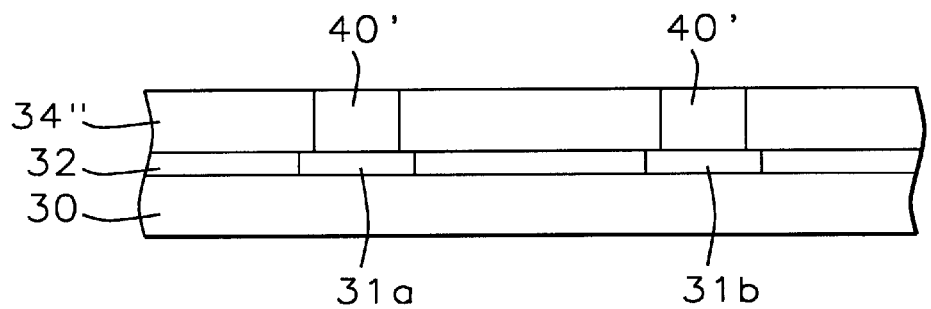

Referring now more particularly to FIG. 12, there is shown a schematic cross-sectional diagram illustrating the results of further processing of the integrated circuit microelectronics fabrication whose schematic cross-sectional diagram is shown in FIG. 11 in accord with the second preferred embodiment of the present invention. Shown in FIG. 12 is an integrated circuit microelectronics fabrication otherwise equivalent to the integrated circuit microelectronics fabrication shown in FIG. 11, but where there has been planarized the surface of the substrate to form a coplanar surface of the second conductor layer 40" and the low dielectric constant dielectric layer 34.

With respect to the co-planar surfaces 40" and 34 of the second conductor layer 40 and the low dielectric constant dielectric layer 34 respectively shown in FIG. 12, the co-planar surfaces 40" and 34 are formed by chemical mechanical polish (CMP) planarization employing methods analogous or equivalent to the CMP methods shown in FIG. 6 of the first preferred embodiment of the present invention.

An optional feature of the present invention not shown in the second preferred embodiment may be the formation of an upper patterned microelectronics conductor layer over the substrate to complete the formation of an inter-level metal dielectric (IMD) layer.

As is understood by a person skilled in the art, the preferred embodiments of the present invention are illustrative of the present invention rather than restrictive of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A method for forming within a low dielectric constant dielectric layer upon a semiconductor substrate employed within an integrated circuit microelectronics fabrication a patterned microelectronics conductor layer employing lift off of a hard mask layer comprising:

providing a semiconductor substrate;

forming over the semiconductor substrate a dielectric layer within which are conductor regions therein forming a first patterned microelectronics conductor layer;

forming over the first patterned microelectronics conductor layer a low dielectric constant dielectric layer;

forming over the low dielectric constant dielectric layer a hard mask layer;

forming over the hard mask layer a first patterned photoresist etch mask layer;

etching, while employing a first subtractive etching environment and the first patterned photoresist etch mask layer, a pattern into and through the hard mask layer;

etching, while employing a second etching environment and the patterned hard mask layer, the pattern into and through the low dielectric constant dielectric layer to the underlying conductor regions and stripping the first patterned photoresist etch mask layer;

forming over the patterned hard mask layer a microelectronics conductor layer; and delaminating and lifting off the patterned hard mask layer employing wet chemical treatment, to leave behind a second patterned microelectronics conductor layer.

2. The method of claim 1 further comprising:

planarizing the second patterned microelectronics conductor layer;

forming a third microelectronics conductor layer over the patterned second microelectronics conductor layer;

forming over the third conductor layer a second patterned photoresist etch mask layer;

etching, employing a subtractive etching agent and the second patterned photoresist etch mask layer, a patterned third microelectronics conductor layer; and stripping the second photoresist etch mask layer to complete an inter-level metal dielectric (IMD) layer.

3. The method of claim 1 wherein the semiconductor substrate is chosen from the group comprising:

silicon, germanium,

III-V semiconductor compounds,

II-VI semiconductor compounds, and

II-IV-VI semiconductor compounds.

4. The method of claim 1 wherein the dielectric layer is formed of dielectric material selected from the group consisting of:

silicon containing dielectric material, silicon containing spin-on-glass (SOG) dielectric material, and organic polymer spin-on-polymer (SOP) dielectric material.

5. The method of claim 1 wherein the low dielectric constant dielectric layer is formed from material selected from the group consisting of:

fluorinated poly(arylene ether) spin-on-polymer (SOP) dielectric material, and fluorine doped silicon containing glass dielectric material.

6. The method of claim 1 wherein the hard mask layer is formed from a silicon containing dielectric material employing chemical vapor deposition (CVD).

7. The method of claim 1 wherein the first subtractive etching environment is a fluorine containing plasma.

8. The method of claim 1 wherein the second etching environment is an oxidizing plasma.

9. The method of claim 1 wherein the microelectronics conductor layer is formed employing conductor material selected from the group consisting of:

aluminum, aluminum/copper alloy, and copper.

* * * * *